(12) United States Patent
Melanson

(10) Patent No.: US 11,507,199 B2
(45) Date of Patent: Nov. 22, 2022

(54) PSEUDO-DIFFERENTIAL PHASE MEASUREMENT AND QUALITY FACTOR COMPENSATION

(71) Applicant: Cirrus Logic International Semiconductor Ltd., Edinburgh (GB)

(72) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/217,235

(22) Filed: Mar. 30, 2021

(65) Prior Publication Data
US 2022/0317778 A1 Oct. 6, 2022

(51) Int. Cl.
| G06F 3/02 | (2006.01) |
| G01D 5/24 | (2006.01) |
| G01D 5/20 | (2006.01) |
| G01R 27/26 | (2006.01) |

(52) U.S. Cl.
CPC ............ *G06F 3/0202* (2013.01); *G01D 5/20* (2013.01); *G01D 5/24* (2013.01); *G01R 27/2605* (2013.01);
(Continued)

(58) Field of Classification Search
CPC ........ G01R 27/00; G01R 27/02; G01R 27/26; G01R 27/2605; G01R 27/2611;
(Continued)

(56) References Cited

U.S. PATENT DOCUMENTS

| 4,268,822 A | 5/1981 | Olsen |
| 4,888,554 A | 12/1989 | Hyde et al. |

(Continued)

FOREIGN PATENT DOCUMENTS

| CN | 10542884 A | 3/2016 |
| CN | 106471708 A | 3/2017 |

(Continued)

OTHER PUBLICATIONS

First Office Action, China National Intellectual Property Administration, Application No. 201980022689.9, dated Jun. 2, 2021.
(Continued)

*Primary Examiner* — Hoai-An D. Nguyen
(74) *Attorney, Agent, or Firm* — Jackson Walker L.L.P.

(57) ABSTRACT

A system may include a resistive-inductive-capacitive sensor, a driver configured to drive the resistive-inductive-capacitive sensor with a plurality of driving signals, each driving signal of the plurality of driving signals having a respective driving frequency, and a measurement circuit communicatively coupled to the resistive-inductive-capacitive sensor and configured to measure a first value of a physical quantity associated with the resistive-inductive-capacitive sensor in response to a first driving signal of the plurality of driving signals, wherein the first driving signal has a first driving frequency; measure a second value of the physical quantity associated with the resistive-inductive-capacitive sensor in response to a second driving signal of the plurality of driving signals, wherein the second driving signal has a second driving frequency; measure a third value of the physical quantity associated with the resistive-inductive-capacitive sensor in response to the first driving signal; measure a fourth value of the physical quantity associated with the resistive-inductive-capacitive sensor in response to the second driving signal; determine a first difference between the third value and the first value; determine a second difference between the fourth value and the second value; and based on the first difference and the second difference, determine if a change in a resonant property of the resistive-inductive-capacitive sensor has occurred, and determine if a change in a quality factor of the resistive-inductive-capacitive sensor has occurred.

30 Claims, 9 Drawing Sheets

(52) U.S. Cl.
CPC ...... *G01R 27/2611* (2013.01); *G01R 27/2688* (2013.01)

(58) Field of Classification Search
CPC ........ G01R 27/2688; G01D 5/00; G01D 5/12; G01D 5/14; G01D 5/20; G01D 5/24; G06F 3/00; G06F 3/01; G06F 3/02; G06F 3/0202
USPC ............. 324/600, 629, 633, 649, 652, 76.11, 324/76.39, 76.52
See application file for complete search history.

(56) References Cited

U.S. PATENT DOCUMENTS

| | | | |
|---|---|---|---|
| 5,286,941 | A | 2/1994 | Bel |
| 5,361,184 | A | 11/1994 | El-Sharkawi et al. |
| 5,567,920 | A | 10/1996 | Watanabe et al. |
| 5,661,269 | A | 8/1997 | Fukuzaki et al. |
| 5,898,136 | A | 4/1999 | Katsurahira |
| 6,231,520 | B1 | 5/2001 | Maezawa |
| 6,380,923 | B1 | 4/2002 | Fukumoto et al. |
| 6,473,708 | B1 | 10/2002 | Watkins et al. |
| 7,173,410 | B1 | 2/2007 | Pond |
| 8,144,126 | B2 | 3/2012 | Wright |
| 8,384,378 | B2 | 2/2013 | Feldkamp et al. |
| 8,421,446 | B2 | 4/2013 | Straubinger et al. |
| 8,674,950 | B2 | 3/2014 | Olson |
| 8,970,230 | B2 | 3/2015 | Narayanasamy et al. |
| 9,070,856 | B1* | 6/2015 | Rose ................... B06B 1/0261 |
| 9,164,605 | B1 | 10/2015 | Pirogov et al. |
| 9,707,502 | B1 | 7/2017 | Bonitas et al. |
| 10,168,855 | B2 | 1/2019 | Baughman et al. |
| 10,372,328 | B2 | 8/2019 | Zhai |
| 10,571,307 | B2 | 2/2020 | Acker |
| 10,599,247 | B2 | 3/2020 | Winokur et al. |
| 10,624,691 | B2 | 4/2020 | Wiender et al. |
| 10,642,435 | B2 | 5/2020 | Maru et al. |
| 10,725,549 | B2 | 7/2020 | Marijanovic et al. |
| 10,726,715 | B2 | 7/2020 | Hwang et al. |
| 10,908,200 | B2 | 2/2021 | You et al. |
| 10,921,159 | B1 | 2/2021 | Das et al. |
| 10,935,620 | B2 | 3/2021 | Das et al. |
| 10,942,610 | B2 | 3/2021 | Maru et al. |
| 10,948,313 | B2 | 3/2021 | Kost et al. |
| 11,079,874 | B2 | 8/2021 | Lapointe et al. |
| 11,204,670 | B2 | 12/2021 | Maru et al. |
| 11,294,503 | B2 | 4/2022 | Westerman |
| 2001/0045941 | A1 | 11/2001 | Rosenberg et al. |
| 2003/0038624 | A1 | 2/2003 | Hilliard et al. |
| 2005/0192727 | A1 | 9/2005 | Shostak et al. |
| 2005/0258826 | A1 | 11/2005 | Kano et al. |
| 2005/0283330 | A1 | 12/2005 | Laraia et al. |
| 2006/0025897 | A1 | 2/2006 | Shostak et al. |
| 2006/0293864 | A1 | 12/2006 | Soss |
| 2007/0047634 | A1 | 3/2007 | Kang et al. |
| 2007/0198926 | A1 | 8/2007 | Joguet et al. |
| 2007/0268265 | A1 | 11/2007 | XiaoPing |
| 2007/0296593 | A1 | 12/2007 | Hall et al. |
| 2007/0296709 | A1 | 12/2007 | GuangHai |
| 2008/0007534 | A1 | 1/2008 | Peng et al. |
| 2008/0024456 | A1 | 1/2008 | Peng et al. |
| 2008/0088594 | A1 | 4/2008 | Liu et al. |
| 2008/0088595 | A1 | 4/2008 | Liu et al. |
| 2008/0142352 | A1 | 6/2008 | Wright |
| 2008/0143681 | A1 | 6/2008 | XiaoPing |
| 2008/0150905 | A1 | 6/2008 | Grivna et al. |
| 2008/0158185 | A1 | 7/2008 | Westerman |
| 2009/0008161 | A1 | 1/2009 | Jones et al. |
| 2009/0058430 | A1 | 3/2009 | Zhu |
| 2009/0140728 | A1 | 6/2009 | Rollins et al. |
| 2009/0278685 | A1 | 11/2009 | Potyrailo et al. |
| 2009/0302868 | A1 | 12/2009 | Feucht et al. |
| 2009/0308155 | A1 | 12/2009 | Zhang |
| 2010/0019777 | A1* | 1/2010 | Balslink ................ G01C 19/56 324/633 |
| 2010/0045360 | A1 | 2/2010 | Howard et al. |
| 2010/0153845 | A1 | 6/2010 | Gregorio et al. |
| 2010/0211902 | A1 | 8/2010 | Unsworth et al. |
| 2010/0231239 | A1 | 9/2010 | Tateishi et al. |
| 2010/0238121 | A1 | 9/2010 | Ely |
| 2010/0328249 | A1 | 12/2010 | Ningrat et al. |
| 2011/0005090 | A1 | 1/2011 | Lee et al. |
| 2011/0214481 | A1 | 9/2011 | Kachanov et al. |
| 2011/0216311 | A1 | 9/2011 | Kachanov et al. |
| 2011/0267302 | A1 | 11/2011 | Fasshauer |
| 2011/0285667 | A1 | 11/2011 | Poupyrev et al. |
| 2011/0291821 | A1 | 12/2011 | Chung |
| 2011/0301876 | A1 | 12/2011 | Yamashita |
| 2013/0018489 | A1 | 1/2013 | Grunthaner et al. |
| 2013/0076374 | A1 | 3/2013 | Huang |
| 2013/0106756 | A1 | 5/2013 | Kono et al. |
| 2013/0106769 | A1 | 5/2013 | Bakken et al. |
| 2013/0269446 | A1 | 10/2013 | Fukushima et al. |
| 2014/0002113 | A1 | 1/2014 | Schediwy et al. |
| 2014/0028327 | A1 | 1/2014 | Potyrailo et al. |
| 2014/0137585 | A1 | 5/2014 | Lu et al. |
| 2014/0225599 | A1 | 8/2014 | Hess |
| 2014/0267065 | A1 | 9/2014 | Levesque |
| 2015/0022174 | A1 | 1/2015 | Nikitin |
| 2015/0027139 | A1 | 1/2015 | Lin et al. |
| 2015/0077094 | A1 | 3/2015 | Baldwin et al. |
| 2015/0084874 | A1 | 3/2015 | Cheng et al. |
| 2015/0293695 | A1 | 10/2015 | Schonleben et al. |
| 2015/0329199 | A1 | 11/2015 | Golborne et al. |
| 2016/0018940 | A1 | 1/2016 | Lo et al. |
| 2016/0048256 | A1 | 2/2016 | Day |
| 2016/0117084 | A1 | 4/2016 | Ording |
| 2016/0162031 | A1 | 6/2016 | Westerman et al. |
| 2016/0169717 | A1 | 6/2016 | Zhitomirsky |
| 2016/0179243 | A1 | 6/2016 | Schwartz |
| 2016/0231874 | A1 | 8/2016 | Baughman et al. |
| 2016/0241227 | A1 | 8/2016 | Hirata |
| 2016/0252403 | A1 | 9/2016 | Murakami |
| 2016/0357296 | A1 | 12/2016 | Picciotto et al. |
| 2017/0077735 | A1 | 3/2017 | Leabman |
| 2017/0093222 | A1 | 3/2017 | Joye et al. |
| 2017/0097437 | A1 | 4/2017 | Widmer et al. |
| 2017/0140644 | A1 | 5/2017 | Hwang et al. |
| 2017/0147068 | A1 | 5/2017 | Yamazaki et al. |
| 2017/0168578 | A1 | 6/2017 | Tsukamoto et al. |
| 2017/0184416 | A1 | 6/2017 | Kohlenberg et al. |
| 2017/0185173 | A1 | 6/2017 | Ito et al. |
| 2017/0187541 | A1 | 6/2017 | Sundaresan et al. |
| 2017/0237293 | A1 | 8/2017 | Faraone et al. |
| 2017/0282715 | A1 | 10/2017 | Fung et al. |
| 2017/0322643 | A1 | 11/2017 | Eguchi |
| 2017/0328740 | A1 | 11/2017 | Widmer et al. |
| 2017/0371380 | A1 | 12/2017 | Oberhauser et al. |
| 2017/0371381 | A1 | 12/2017 | Liu |
| 2017/0371473 | A1 | 12/2017 | David et al. |
| 2018/0019722 | A1 | 1/2018 | Birkbeck |
| 2018/0055448 | A1 | 3/2018 | Karakaya et al. |
| 2018/0059793 | A1 | 3/2018 | Hajati |
| 2018/0067601 | A1 | 3/2018 | Winokur et al. |
| 2018/0088064 | A1 | 3/2018 | Potyrailo et al. |
| 2018/0088702 | A1 | 3/2018 | Schutzberg et al. |
| 2018/0135409 | A1 | 5/2018 | Wilson et al. |
| 2018/0182212 | A1 | 6/2018 | Li et al. |
| 2018/0183372 | A1 | 6/2018 | Li et al. |
| 2018/0195881 | A1 | 7/2018 | Acker |
| 2018/0221796 | A1 | 8/2018 | Bonitas et al. |
| 2018/0229161 | A1 | 8/2018 | Maki et al. |
| 2018/0231485 | A1 | 8/2018 | Potyrailo et al. |
| 2018/0260049 | A1 | 9/2018 | O'Lionaird et al. |
| 2018/0260050 | A1 | 9/2018 | Unseld et al. |
| 2018/0321748 | A1 | 11/2018 | Rao et al. |
| 2019/0179146 | A1 | 6/2019 | De Nardi |
| 2019/0197218 | A1 | 6/2019 | Schwartz |
| 2019/0204929 | A1 | 7/2019 | Attari et al. |
| 2019/0235629 | A1 | 8/2019 | Hu et al. |
| 2019/0286263 | A1 | 9/2019 | Bagheri et al. |
| 2019/0302161 | A1* | 10/2019 | You ....................... G01D 5/2026 |
| 2019/0302193 | A1 | 10/2019 | Maru et al. |
| 2019/0302890 | A1 | 10/2019 | Marijanovic et al. |

(56) References Cited

U.S. PATENT DOCUMENTS

| | | | |
|---|---|---|---|
| 2019/0302922 A1 | 10/2019 | Das et al. | |
| 2019/0302923 A1 | 10/2019 | Maru et al. | |
| 2019/0326906 A1 | 10/2019 | Camacho Cardenas et al. | |
| 2019/0339313 A1 | 11/2019 | Vandermeijden | |
| 2019/0377468 A1 | 12/2019 | Micci et al. | |
| 2020/0064952 A1 | 1/2020 | Siemieniec et al. | |
| 2020/0064160 A1 | 2/2020 | Maru et al. | |
| 2020/0133455 A1 | 4/2020 | Sepehr et al. | |
| 2020/0177290 A1 | 6/2020 | Reimer et al. | |
| 2020/0191761 A1 | 6/2020 | Potyrailo et al. | |
| 2020/0271477 A1 | 8/2020 | Kost et al. | |
| 2020/0271706 A1 | 8/2020 | Wardlaw et al. | |
| 2020/0271745 A1 | 8/2020 | Das et al. | |
| 2020/0272301 A1 | 8/2020 | Duewer et al. | |
| 2020/0319237 A1 | 10/2020 | Maru et al. | |
| 2020/0320966 A1 | 10/2020 | Clark et al. | |
| 2020/0373923 A1 | 11/2020 | Walsh et al. | |
| 2020/0382113 A1 | 12/2020 | Beardsworth et al. | |
| 2021/0064137 A1 | 3/2021 | Wopat et al. | |
| 2021/0140797 A1 | 5/2021 | Kost et al. | |
| 2021/0149538 A1 | 5/2021 | LaPointe et al. | |
| 2021/0152174 A1 | 5/2021 | Yancey et al. | |
| 2021/0361940 A1* | 11/2021 | Yeh | H01G 4/35 |
| 2021/0396610 A1 | 12/2021 | Li et al. | |
| 2021/0404901 A1 | 12/2021 | Kost et al. | |
| 2021/0405764 A1 | 12/2021 | Hellman et al. | |
| 2022/0075500 A1 | 3/2022 | Chang et al. | |
| 2022/0268233 A1 | 8/2022 | Kennedy et al. | |

FOREIGN PATENT DOCUMENTS

| | | | | |
|---|---|---|---|---|
| CN | 107076623 A * | 8/2017 | | G01B 7/22 |
| CN | 209069345 U | 7/2019 | | |
| DE | 4004450 A1 | 8/1991 | | |
| DE | 602004005672 T2 * | 12/2007 | | G01D 5/2073 |
| DE | 102015215330 A1 | 2/2017 | | |
| DE | 102015215331 A1 | 2/2017 | | |
| EP | 1697710 B1 | 4/2007 | | |
| EP | 2682843 A1 | 1/2014 | | |
| GB | 2394295 A | 4/2004 | | |
| GB | 2573644 A | 11/2019 | | |
| GB | 2586722 B | 2/2022 | | |
| JP | 2006246289 A | 9/2006 | | |
| KR | 20130052059 A | 5/2013 | | |
| WO | 00/33244 A2 | 6/2000 | | |
| WO | 20061354832 A2 | 12/2006 | | |
| WO | 2007068283 A1 | 6/2007 | | |
| WO | 2016032704 A1 | 3/2016 | | |
| WO | 2021101722 A1 | 5/2021 | | |
| WO | 2021101723 A1 | 5/2021 | | |

OTHER PUBLICATIONS

First Office Action, China National Intellectual Property Administration, Application No. 201980022693.5, dated Jul. 8, 2021.
International Search Report and Written Opinion of the International Searching Authority, International Application No. PCT/US2021/035695, dated Sep. 9, 20201.
Second Office Action, China National Intellectual Property Administration, Application No. 201980022689 9, dated Oct. 27, 2021.
Second Office Action, China National Intellectual Property Administration, Application No. 201980022693.5, dated Dec. 14, 2021.
Combined Search and Examination Report under Sections 17 and 18(3), UKIPO, Application No. GB2111666.0, dated Feb. 11, 2022.
Examination Report under Section 18(3), UKIPO, Application No. GB2101804.9, dated Feb. 25, 2022.
International Search Report and Written Opinion of the International Searching Authority, International Application No. PCT/US2022/012721, dated Apr. 26, 2022.
Second Office Action, China National Intellectual Property Administration, Application No. 201980022693.5, dated Apr. 13, 2022.
Examination Report under Section 18(3), UKIPO, Application No. GB2015439.9, dated May 10, 2022.
International Search Report and Written Opinion of the International Searching Authority, International Application No. PCT/US2019/045554, dated Oct. 17, 2019.
Combined Search and Examination Report, UKIPO, Application No. GB1904250.6, dated Sep. 10, 2019.
International Search Report and Written Opinion of the International Searching Authority, International Application No. PCT/US2019/022518, dated May 24, 2019.
International Search Report and Written Opinion of the International Searching Authority, International Application No. PCT/US2019/022578, dated May 27, 2019.
International Search Report and Written Opinion of the International Searching Authority, International Application No. PCT/US2019/021838, dated May 27, 2019.
Combined Search and Examination Report under Sections 17 and 18(3), UKIPO, Application No. GB2001341.3, dated Jun. 29, 2020.
International Search Report and Written Opinion of the International Searching Authority, International Application No. PCT/US2020/059113, dated Feb. 23, 2021.
International Search Report and Written Opinion of the International Searching Authority, International Application No. PCT/US2020/059101, dated Mar. 9, 2021.
International Search Report and Written Opinion of the International Searching Authority, International Application No. PCT/US2022/018886, dated Jun. 10, 2022.
Combined Search and Examination Report under Sections 17 and 18(3), UKIPO, Application No. GB2201194.4, dated Jul. 1, 2022.
First Office Action, China National Intellectual Property Administration, Application No. 202010105829.3, dated Apr. 12, 2022, received by counsel Jul. 28, 2022.
International Search Report and Written Opinion of the International Searching Authority, International Application No. PCT/US2022/018475, dated Aug. 2, 2022.
Notice of Preliminary Rejection, Korean Intellectual Property Office, Application No. 10-2020-7029597, dated Jul. 29, 2022.

* cited by examiner

PSEUDO-DIFFERENTIAL PHASE MEASUREMENT AND QUALITY FACTOR COMPENSATION

FIELD OF DISCLOSURE

The present disclosure relates in general to electronic devices with user interfaces, (e.g., mobile devices, game controllers, instrument panels, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices to be waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, dynamic range, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a resistive-inductive-capacitive sensor, a driver configured to drive the resistive-inductive-capacitive sensor with a plurality of driving signals, each driving signal of the plurality of driving signals having a respective driving frequency, and a measurement circuit communicatively coupled to the resistive-inductive-capacitive sensor and configured to measure a first value of a physical quantity associated with the resistive-inductive-capacitive sensor in response to a first driving signal of the plurality of driving signals, wherein the first driving signal has a first driving frequency; measure a second value of the physical quantity associated with the resistive-inductive-capacitive sensor in response to a second driving signal of the plurality of driving signals, wherein the second driving signal has a second driving frequency; measure a third value of the physical quantity associated with the resistive-inductive-capacitive sensor in response to the first driving signal; measure a fourth value of the physical quantity associated with the resistive-inductive-capacitive sensor in response to the second driving signal; determine a first difference between the third value and the first value; determine a second difference between the fourth value and the second value; and based on the first difference and the second difference, determine if a change in a resonant property of the resistive-inductive-capacitive sensor has occurred, and determine if a change in a quality factor of the resistive-inductive-capacitive sensor has occurred.

In accordance with embodiments of the present disclosure, a method may include, in a system including a resistive-inductive-capacitive sensor and a driver configured to drive the resistive-inductive-capacitive sensor with a plurality of driving signals, each driving signal of the plurality of driving signals having a respective driving frequency, measuring a first value of a physical quantity associated with the resistive-inductive-capacitive sensor in response to a first driving signal of the plurality of driving signals, wherein the first driving signal has a first driving frequency; measuring a second value of the physical quantity associated with the resistive-inductive-capacitive sensor in response to a second driving signal of the plurality of driving signals, wherein the second driving signal has a second driving frequency; measuring a third value of the physical quantity associated with the resistive-inductive-capacitive sensor in response to the first driving signal; measuring a fourth value of the physical quantity associated with the resistive-inductive-capacitive sensor in response to the second driving signal; determining a first difference between the third value and the first value; determining a second difference between the fourth value and the second value; and based on the first difference and the second difference, determining if a change in a resonant property of the resistive-inductive-capacitive sensor has occurred.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 4A:
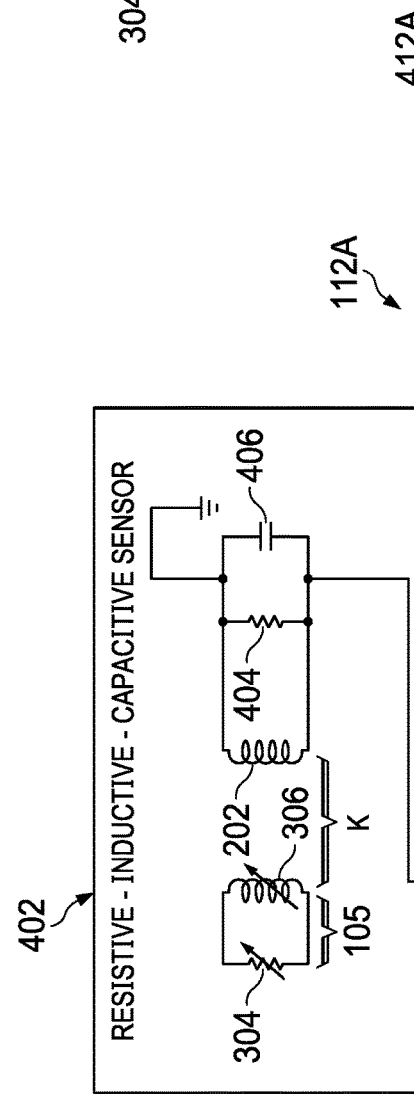
Figure 4B:
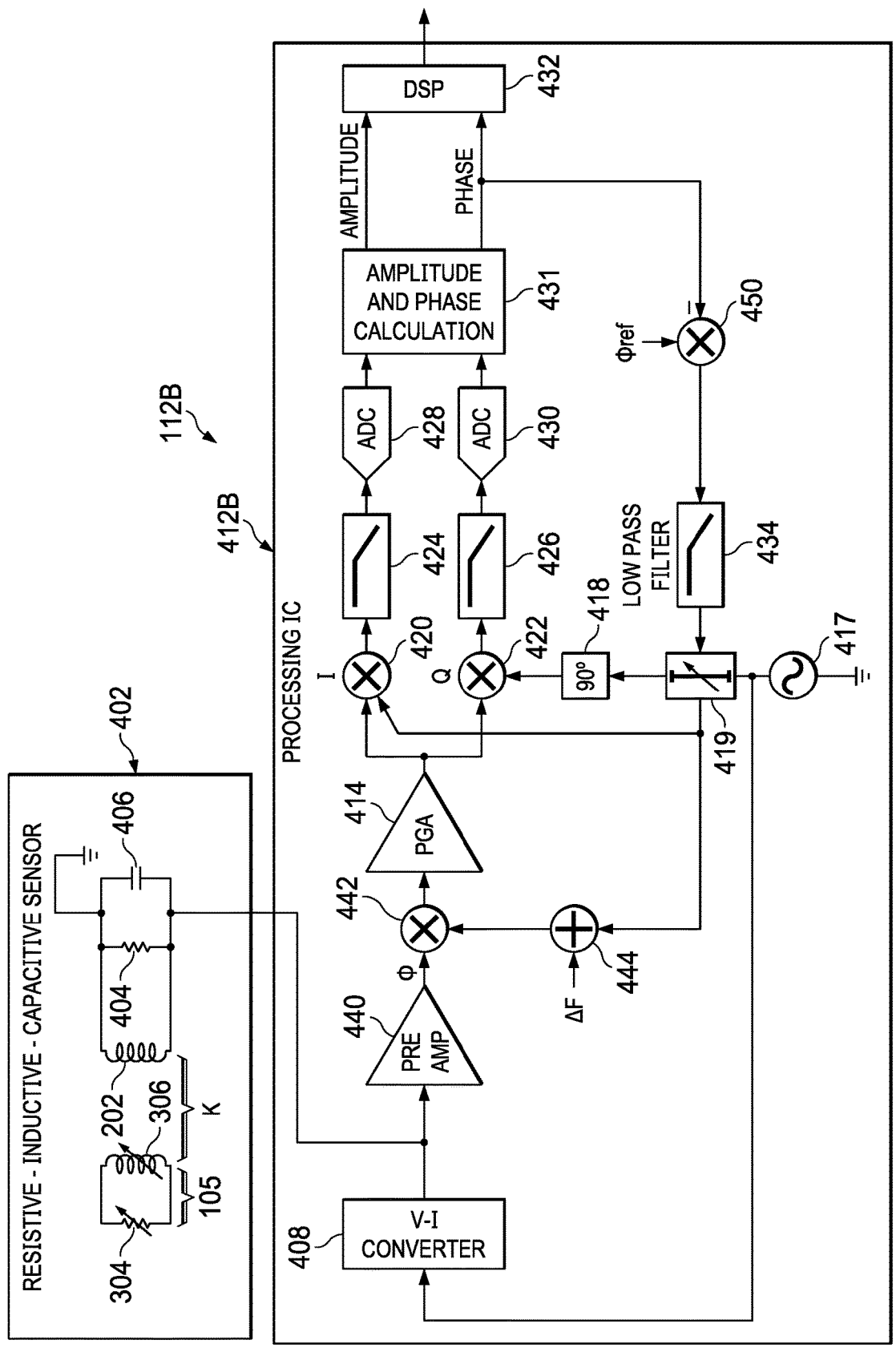
Figure 4C:
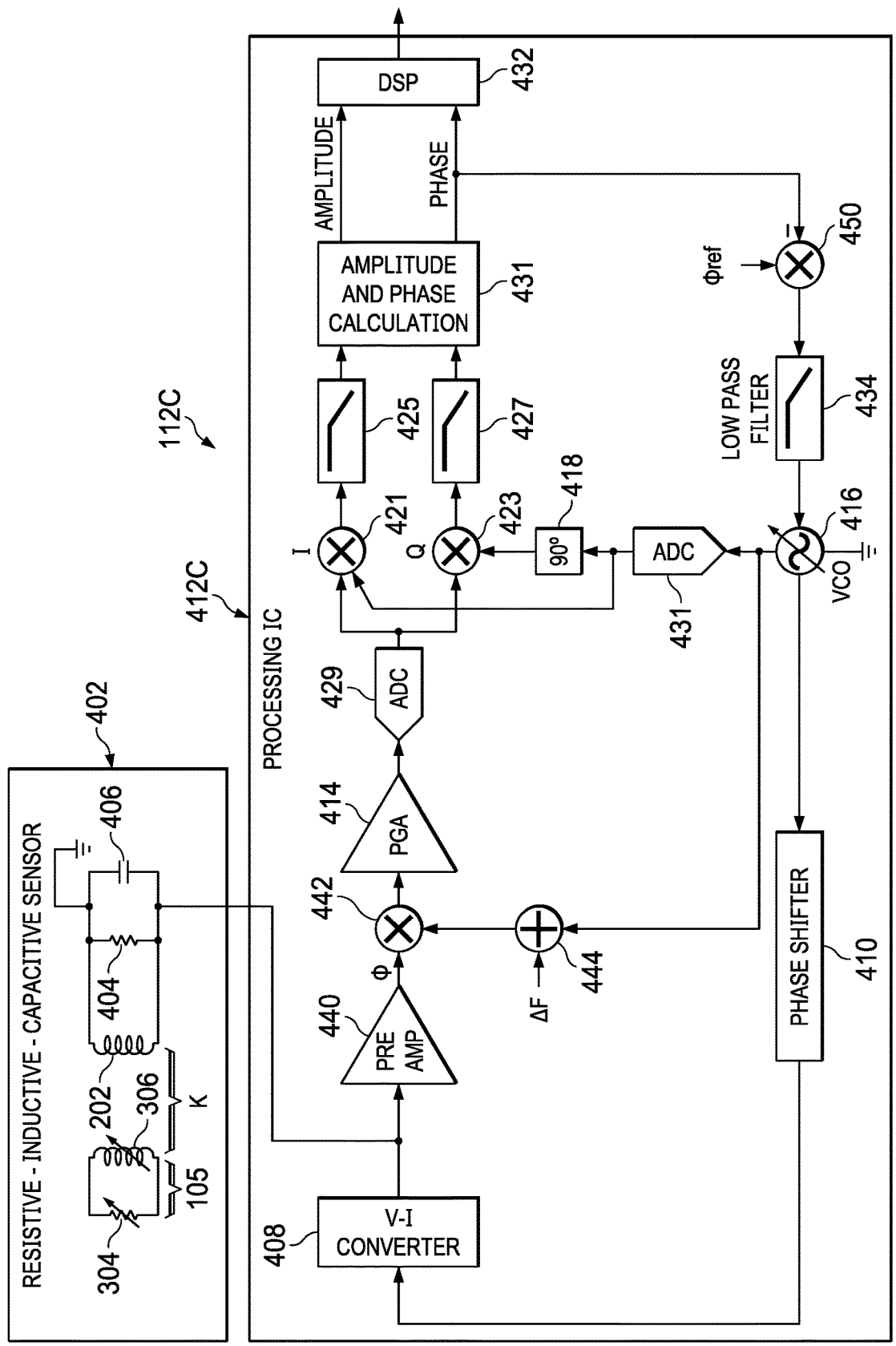
Figure 5:
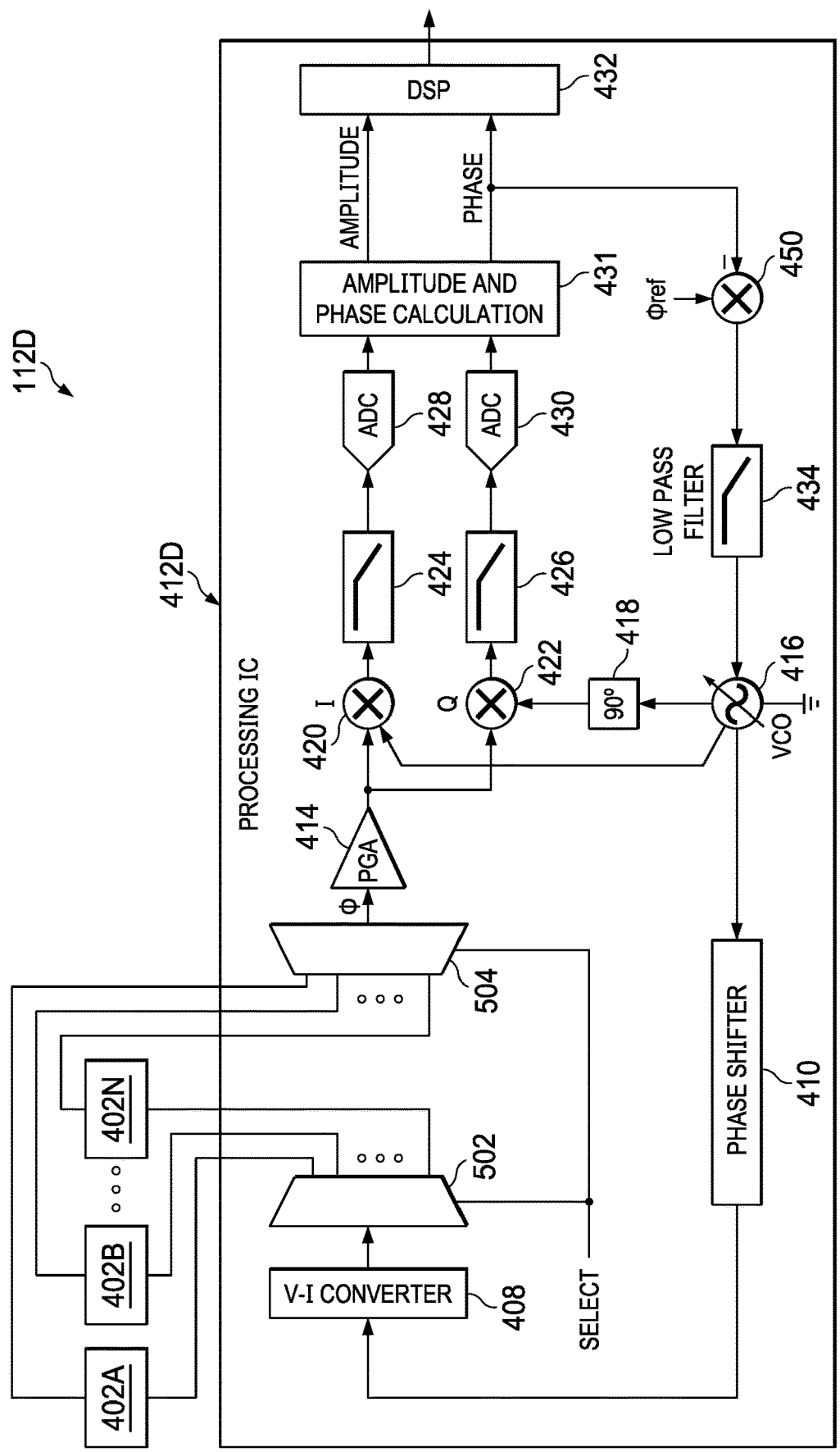
Figure 6A:
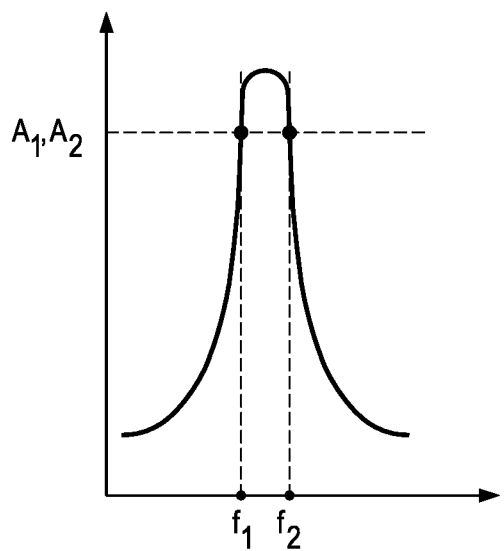
Figure 6B:
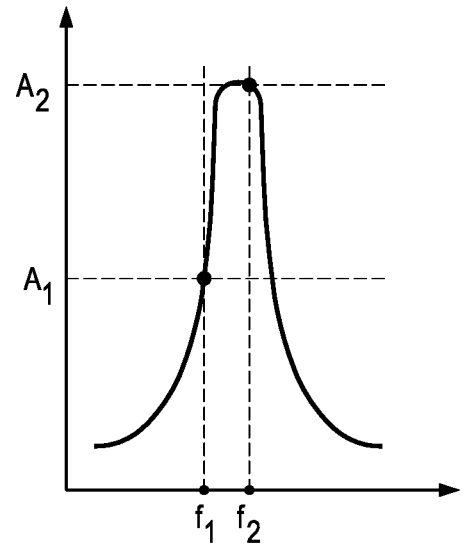
Figure 6C:
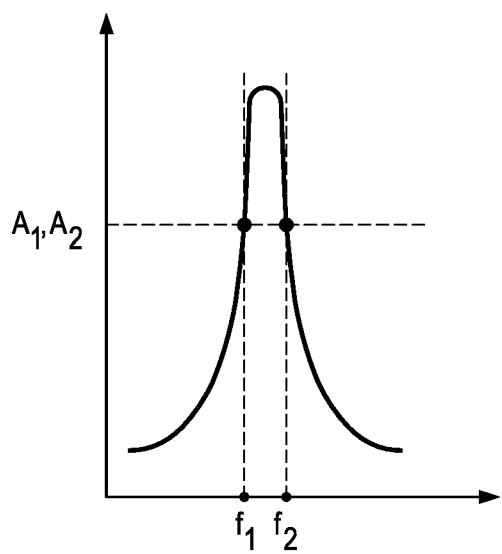
Figure 7A:
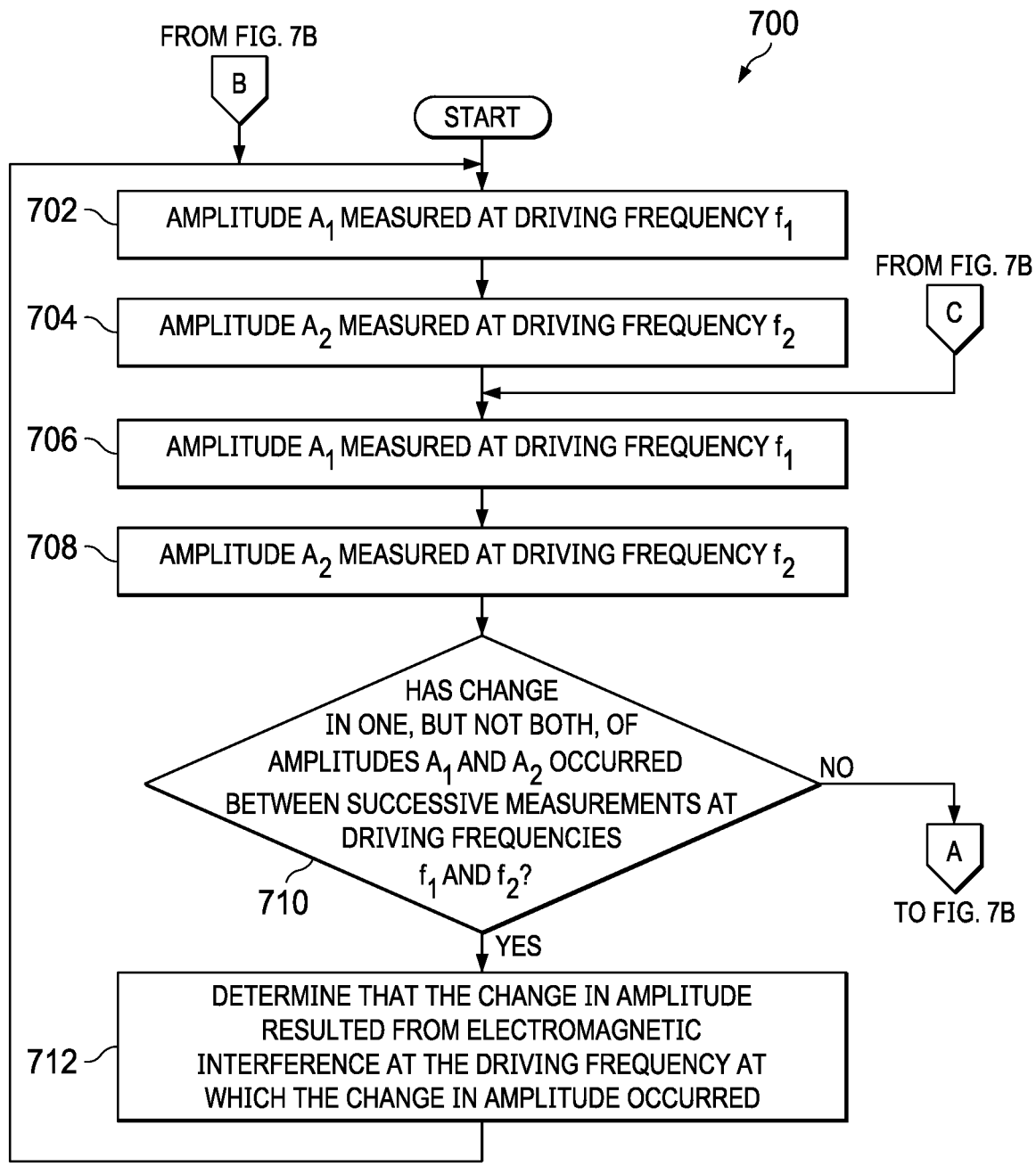
Figure 7B:
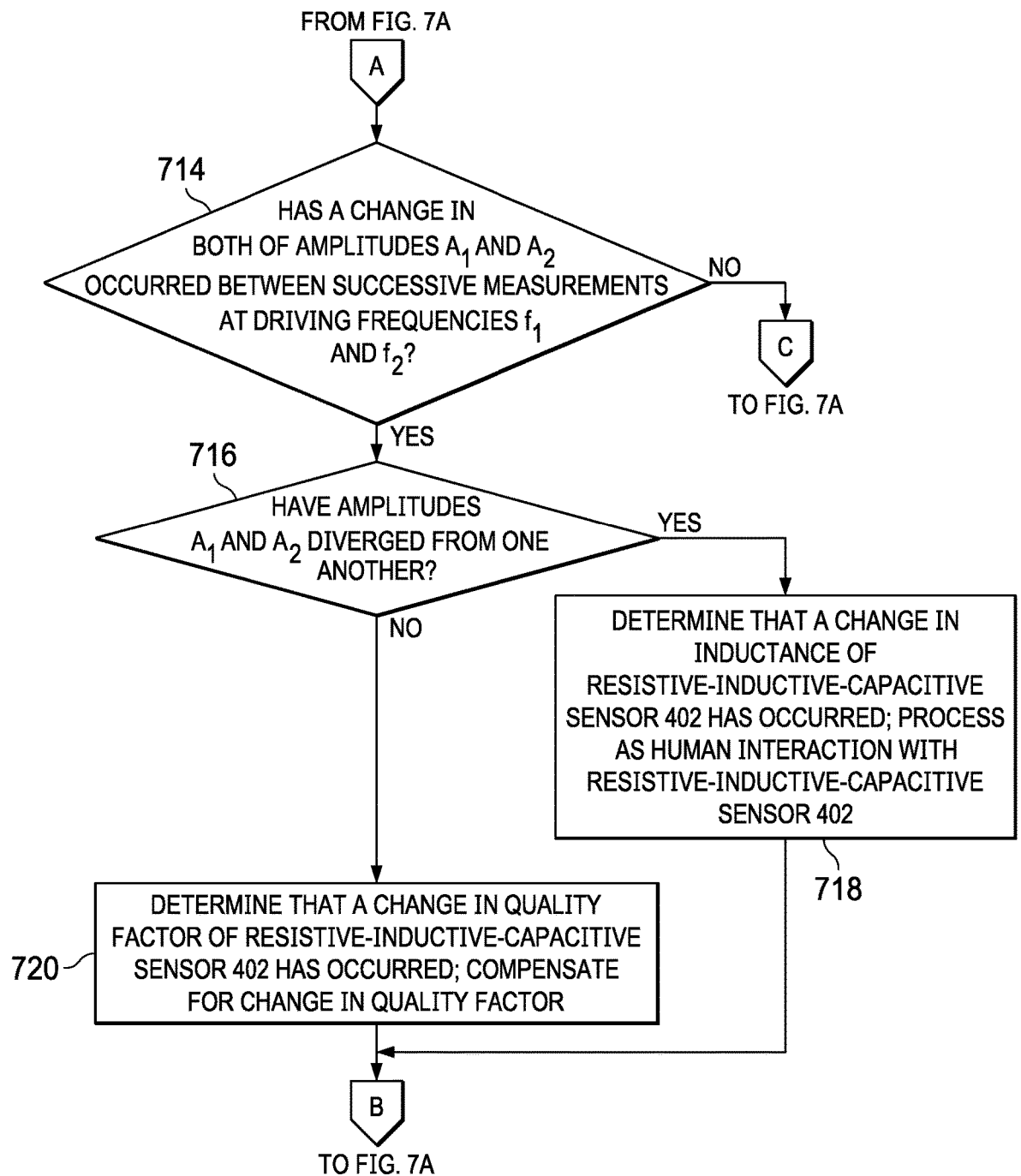
Figure 8A:
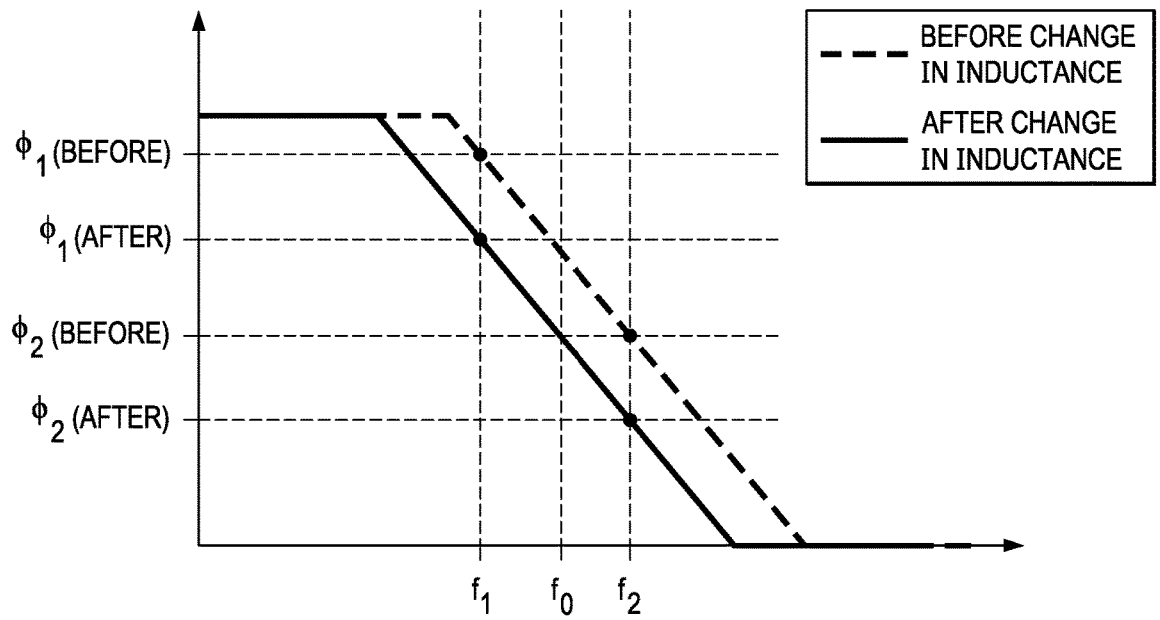
Figure 8B:
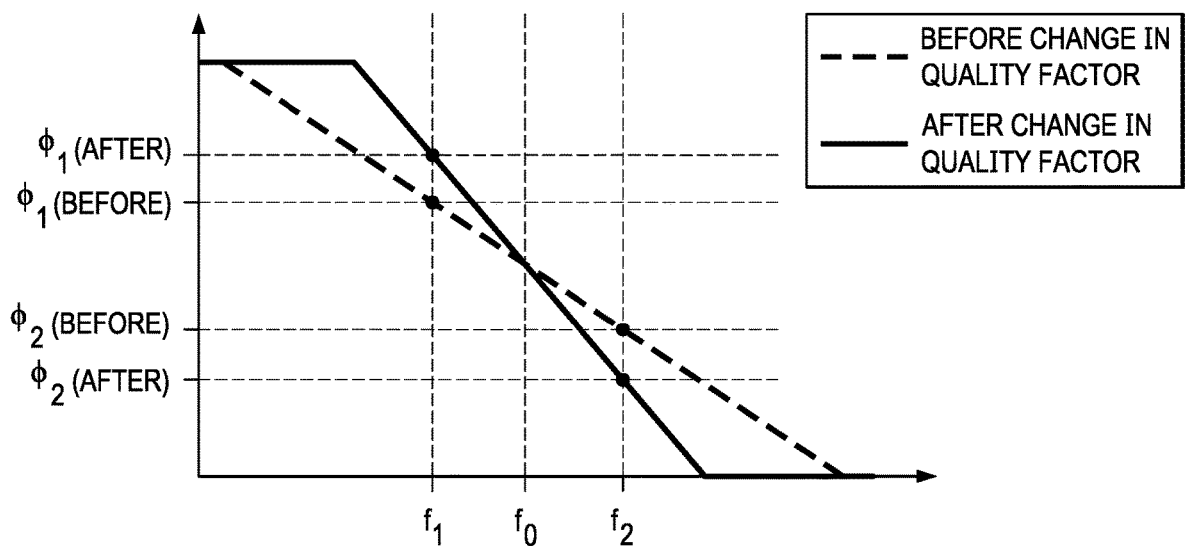

Each of FIGS. 4A-4C illustrates a diagram of selected components of an example resonant phase sensing system, in accordance with embodiments of the present disclosure;

FIG. 5 illustrates a diagram of selected components of an example resonant phase sensing system implementing time-division multiplexed processing of multiple resistive-inductive-capacitive sensors, in accordance with embodiments of the present disclosure;

FIG. 6A illustrates a graph of an example amplitude versus frequency relationship for a resistive-inductive-capacitive sensor in the absence of human interaction with the resistive-inductive-capacitive sensor, in accordance with embodiments of the present disclosure;

FIG. 6B illustrates a graph of an example amplitude versus frequency relationship for a resistive-inductive-capacitive sensor in the presence of human interaction with the resistive-inductive-capacitive sensor, in accordance with embodiments of the present disclosure;

FIG. 6C illustrates a graph of an example amplitude versus frequency relationship for a resistive-inductive-capacitive sensor resulting from a change in quality factor of the resistive-inductive-capacitive sensor, in accordance with embodiments of the present disclosure;

FIGS. 7A and 7B, collectively referred to herein as FIG. 7, illustrate a flowchart of an example method for pseudo-differential phase measurement, in accordance with embodiments of the present disclosure;

FIG. 8A illustrates a graph of an example phase versus frequency relationship for a resistive-inductive-capacitive sensor in the presence of human interaction with the resistive-inductive-capacitive sensor, in accordance with embodiments of the present disclosure; and FIG. 8B illustrates a graph of an example phase versus frequency relationship for a resistive-inductive-capacitive sensor resulting from a change in quality factor of the resistive-inductive-capacitive sensor, in accordance with embodiments of the present disclosure.

DETAILED DESCRIPTION

Figure 1:
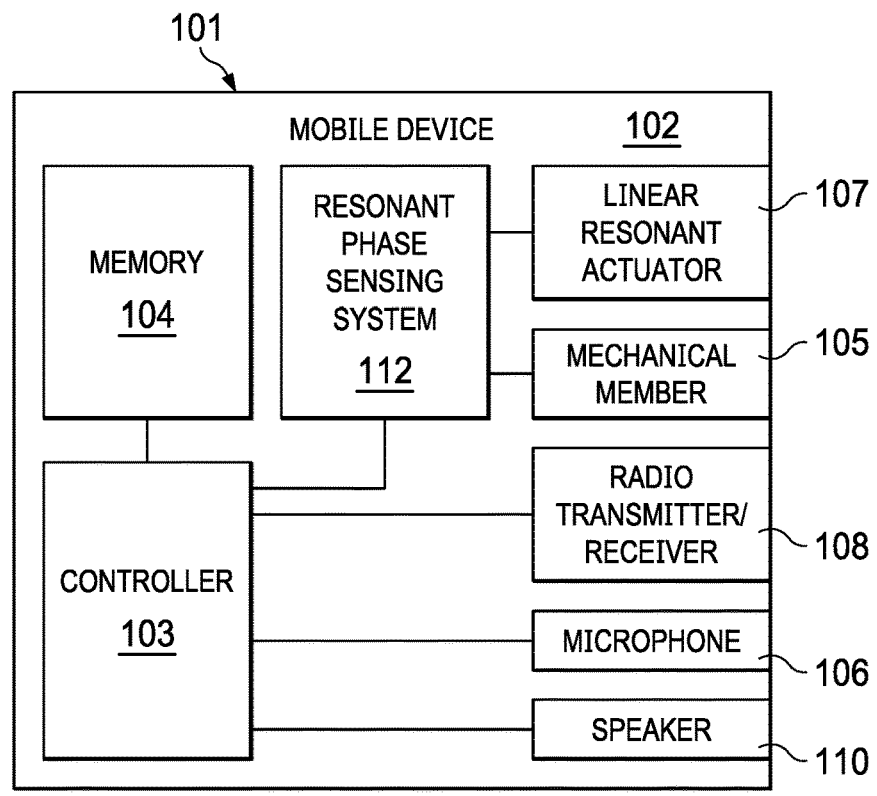
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, speaker 110 may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sensing system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments, resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Figure 2:
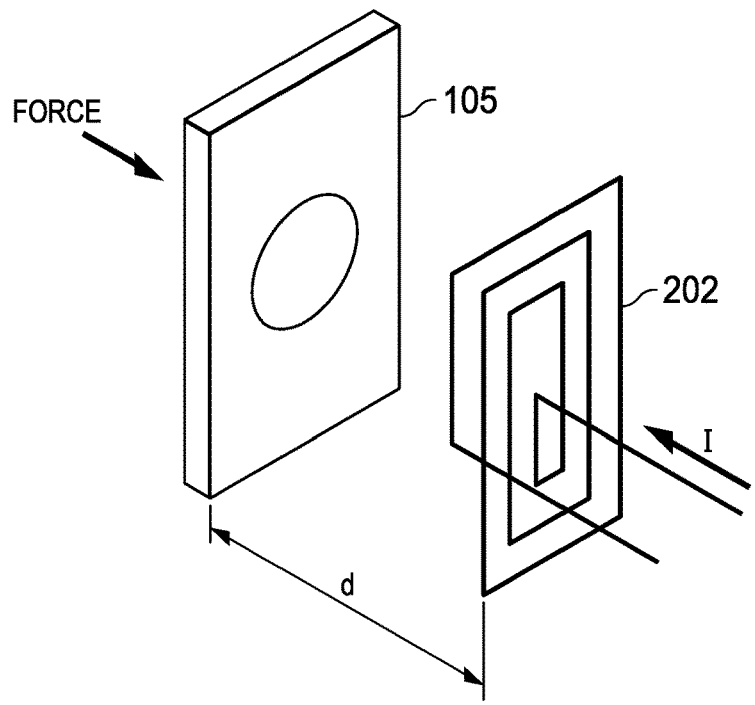
FIG. 2 illustrates a mechanical member separated by a distance from an inductive coil, in accordance with embodiments of the present disclosure.
Figure 3:
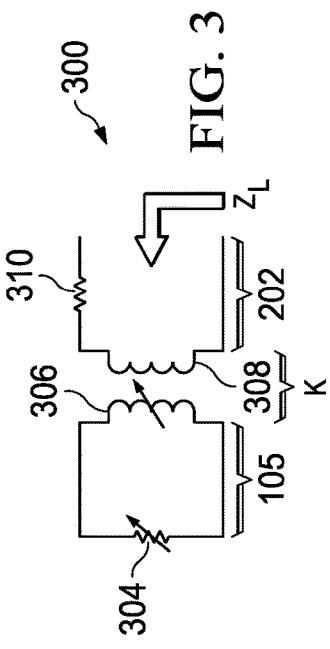
FIG. 3 illustrates selected components of an inductive sensing system that may be implemented by a resonant phase sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of an inductive sensing system 300 that may be implemented by resonant phase sensing system 112, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, and a combiner 450. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to detect an oscillation signal generated by processing IC 412A (as explained in greater detail below) and phase shift such oscillation signal (e.g., by 45 degrees) such that a normal operating frequency of resonant phase sensing system 112A, an incident component of a sensor signal φ generated by pre-amplifier 440, is approximately equal to a quadrature component of sensor signal φ, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal φ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal φ and condition sensor signal φ for frequency mixing, with mixer 442, to an intermediate frequency Δf combined by combiner 444 with an oscillation frequency generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal φ directly from resistive-inductive-capacitive sensor 402. However, when present, preamplifier 440, mixer 442, and combiner 444 may allow for mixing sensor signal φ down to a lower intermediate frequency Δf which may allow for lower-bandwidth and more efficient ADCs (e.g., ADCs 428 and 430 of FIGS. 4A and 4B and ADC 429 of FIG. 4C, described below) and/or which may allow for minimization of phase and/or gain mismatches in the incident and quadrature paths of the phase detector of processing IC 412A.

In operation, PGA 414 may further amplify sensor signal φ to condition sensor signal φ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal φ. As shown in FIG. 4A, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal 4, low-pass filter 424 may filter out the oscillation signal mixed with the amplified sensor signal φ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal 4, low-pass filter 426 may filter out the phase-shifted oscillation signal mixed with the amplified sensor signal φ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal $\phi$ towards reference phase $\phi_{ref}$. As a result, sensor signal $\phi$ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 434 in connection with VCO 416 may implement a feedback control loop that may track changes in operating parameters of resonant phase sensing system 112A by modifying the driving frequency of VCO 416.

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below. As shown FIG. 4B, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

Processing IC 412B may include fixed-frequency oscillator 417 and variable phase shifter 419 in lieu of VCO 416 of processing IC 412A. Thus, in operation, oscillator 417 may drive a fixed driving signal and oscillation signal which variable phase shifter 419 may phase shift to generate oscillation signals to be mixed by mixers 420 and 422. Similar to that of processing IC 412A, low-pass filter 434 may low-pass filter an error signal based on phase information extracted by amplitude and phase calculation block 431, but instead such filtered error signal may be applied to variable phase shifter 419 to modify the phase offset of the oscillation signal generated by oscillator 417, in order to drive sensor signal $\phi$ towards indicating a phase shift of zero. As a result, sensor signal $\phi$ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 434 in connection with variable phase shifter 419 may implement a feedback control loop that may track changes in operating parameters of resonant phase sensing system 112B by modifying the phase shift applied by variable phase shifter 419.

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112A of FIG. 4A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 429 in lieu of ADC 428 and ADC 430. Accordingly, a coherent incident/quadrature detector for resonant phase sensing system 112C may be implemented with an incident channel comprising a digital mixer 421 and a digital low-pass filter 425 (in lieu of analog mixer 420 and analog low-pass filter 424) and a quadrature channel comprising a digital mixer 423 and a low-pass filter 427 (in lieu of analog mixer 422 and analog low-pass filter 426) such that processing IC 412C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

FIG. 5 illustrates a diagram of selected components of an example resonant phase sensing system 112D implementing time-division multiplexed processing of multiple resistive-inductive-capacitive sensors 402 (e.g., resistive-inductive-capacitive sensors 402A-402N shown in FIG. 5), in accordance with embodiments of the present disclosure. In some embodiments, resonant phase sensing system 112D may be used to implement resonant phase sensing system 112 of FIG. 1. Resonant phase sensing system 112D of FIG. 5 may be, in many respects, similar to resonant phase sensing system 112A of FIG. 4A. Accordingly, only those differences between resonant phase sensing system 112D and resonant phase sensing system 112A may be described below. In particular, resonant phase sensing system 112D may include a plurality of resistive-inductive-capacitive sensors 402 (e.g., resistive-inductive-capacitive sensors 402A-402N shown in FIG. 5) in lieu of the single resistive-inductive-capacitive sensor 402 shown in FIG. 4A. In addition, resonant phase sensing system 112D may include multiplexers 502 and 504, each of which may select an output signal from a plurality of input signals responsive to a control signal SELECT (which may be controlled by a time-division multiplexing control subsystem implemented by controller 103 or another suitable component of mobile device 102). Thus, while in some embodiments a device such as mobile device 102 may comprise a plurality of resistive-inductive-capacitive sensors 402 which may be simultaneously driven and separately processed by a respective processing IC, in other embodiments a resonant phase sensing system (e.g., resonant phase sensing system 112D) may drive resistive-inductive-capacitive sensors 402 in a time-division multiplexed manner Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

For purposes of clarity and exposition, preamplifier 440, mixer 442, and combiner 444 have been excluded from FIG. 5. However, in some embodiments, processing IC 412D may include preamplifier 440, mixer 442, and combiner 444 similar to that depicted in FIGS. 4A-4C.

In resonant phase sensing system 112D, when a first resistive-inductive-capacitive sensor (e.g., resistive-inductive-capacitive sensor 402A) is selected by the time-division multiplexing control subsystem for being driven by voltage-to-current converter 408 and measured by the measurement circuit implemented by processing IC 412A, other resistive-inductive-capacitive sensors (e.g., resistive-inductive-capacitive sensors 402B-402N) may each be placed in a low-impedance state. Similarly, when a second resistive-inductive-capacitive sensor (e.g., resistive-inductive-capacitive sensor 402B) is selected by the time-division multiplexing control subsystem for being driven by voltage-to-current converter 408 and measured by the measurement circuit implemented by processing IC 412A, other resistive-inductive-capacitive sensors (e.g., resistive-inductive-capacitive sensors other than 402B, including 402A) may each be placed in a low-impedance state. Such an approach may minimize power consumption within unselected resistive-inductive-capacitive sensors 402.

Although not explicitly shown, resonant phase sensing system 112B could be modified in a manner similar to that of how resonant phase sensing system 112A is shown to be modified to result in resonant phase sensing system 112D, such that resonant phase sensing system 112B could implement time-division multiplexed sensing on a plurality of resistive-inductive-capacitive sensors 402. Similarly, although not explicitly shown, resonant phase sensing system 112C could be modified in a manner similar to that of how resonant phase sensing system 112A is shown to be modified to result in resonant phase sensing system 112D, such that resonant phase sensing system 112C could implement time-division multiplexed sensing on a plurality of resistive-inductive-capacitive sensors 402.

In the processing ICs 412 described above, instead of VCO 416 in conjunction with voltage-to-current converter 408 driving resistive-inductive-capacitive sensor 402 at or near its resonance frequency, a processing IC 412 may employ a different driving scheme whereby resistive-inductive-capacitive sensor 402 is driven using at least two driving signals at different driving frequencies, and amplitude and/or phase measurements are taken in response to the multiple driving signals. The driving frequency used across the multiple measurements may be modified in a predetermined pattern. For example, a simple pattern may involve alternating between two different driving frequencies in successive measurements. Another approach may be that the driving signal is a "chirp" in which the frequency varies across the measurement.

Measuring a difference in amplitude and/or phase at two different drive frequencies may enable DSP 432 to distinguish among a human interaction with resistive-inductive-capacitive sensor 402 (e.g., a displacement of mechanical member 105 indicative of virtual button press or release), a change in quality factor of resistive-inductive-capacitive sensor 402, or the presence of electromagnetic interference. To illustrate, FIG. 6A illustrates a graph of an example amplitude versus frequency relationship for resistive-inductive-capacitive sensor 402 in the absence of human interaction with resistive-inductive-capacitive sensor 402, in accordance with embodiments of the present disclosure. As shown in FIG. 6A, if frequencies $f_1$ and $f_2$ of two driving signals are selected to be symmetric to the resonant frequency $f_0$ of resistive-inductive-capacitive sensor 402 (e.g., $f_1=f_0-\Delta$; $f_2=f_0+\Delta$), a measured amplitude $A_1$ at driving frequency $f_1$ and a measured amplitude $A_2$ at driving frequency $f_2$ may be approximately equal.

In response to a human interaction with resistive-inductive-capacitive sensor 402 (e.g., a displacement of mechanical member 105 indicative of virtual button press or release), an inductance of resistive-inductive-capacitive sensor 402 may change, leading to a shift in resonant frequency $f_0$ of resistive-inductive-capacitive sensor 402. Thus, as shown in FIG. 6B, when human interaction with resistive-inductive-capacitive sensor 402 occurs, the measured amplitude at one of the driving frequencies may decrease (e.g., a decrease in measured amplitude $A_1$ at driving frequency $f_1$ in FIG. 6B) and the measured amplitude at the other of the driving frequencies may increase (e.g., an increase in measured amplitude $A_2$ at driving frequency $f_2$ in FIG. 6B). Thus, a divergence in measured amplitudes $A_1$, $A_2$ may indicate a valid human interaction (e.g., virtual button press) with resistive-inductive-capacitive sensor 402. Likewise, a convergence in measured amplitudes $A_1$, $A_2$ may also indicate a valid human interaction (e.g., virtual button release) with resistive-inductive-capacitive sensor 402.

In response to a change in quality factor of resistive-inductive-capacitive sensor 402 (e.g., as may occur due to changes in temperature or other environmental effects), resonant frequency $f_0$ of resistive-inductive-capacitive sensor 402 may remain predominantly unchanged, but the curve of the amplitude versus frequency relationship for resistive-inductive-capacitive sensor 402 may "widen" or "narrow." For example, FIG. 6C depicts a narrowing of the curve of the amplitude versus frequency relationship for resistive-inductive-capacitive sensor 402 in response to a change in quality factor of resistive-inductive-capacitive sensor 402. Due to such "narrowing," measured amplitude $A_1$ at driving frequency $f_1$ and measured amplitude $A_2$ at driving frequency $f_2$ may both decrease. On the other hand, should a change in quality factor cause "widening" of the curve of the amplitude versus frequency relationship for resistive-inductive-capacitive sensor 402, measured amplitude $A_1$ at driving frequency $f_1$ and measured amplitude $A_2$ at driving frequency $f_2$ may both increase. Accordingly, a change in measured amplitudes $A_1$, $A_2$ in the same direction (e.g., both increasing or both decreasing) may indicate a change in quality factor.

Further, driving resistive-inductive-capacitive sensor 402 at two different frequencies may enable detection of an interfering signal at one of the driving frequencies. For example, if measured amplitude at a first driving frequency changes while the measured amplitude at a second driving frequency remains unchanged, the change in amplitude at the first driving frequency may indicate the presence of interference at the first driving frequency.

FIG. 7 illustrates a flowchart of an example method 700 for pseudo-differential phase measurement, in accordance with embodiments of the present disclosure. According to certain embodiments, method 700 may begin at step 702. As noted above, teachings of the present disclosure may be implemented in a variety of configurations of resonant phase sensing system 112 and processing IC 412. As such, the preferred initialization point for method 700 and the order of the steps comprising method 700 may depend on the implementation chosen.

At step 702, resistive-inductive-capacitive sensor 402 may be driven at a first driving frequency $f_1$ and the coherent incident/quadrature detector of processing IC 412 may determine an amplitude $A_1$ associated with resistive-inductive-capacitive sensor 402 at such driving frequency $f_1$. At step 704, resistive-inductive-capacitive sensor 402 may be driven at a second driving frequency $f_2$ and the coherent incident/quadrature detector of processing IC 412 may determine an amplitude $A_2$ associated with resistive-inductive-capacitive sensor 402 at such driving frequency $f_2$. At step 706, resistive-inductive-capacitive sensor 402 may again be driven at first driving frequency $f_1$ and the coherent incident/quadrature detector of processing IC 412 may determine amplitude $A_1$ associated with resistive-inductive-capacitive sensor 402 at driving frequency $f_1$. At step 708, resistive-inductive-capacitive sensor 402 may again be driven at second driving frequency $f_2$ and the coherent incident/quadrature detector of processing IC 412 may determine amplitude $A_2$ associated with resistive-inductive-capacitive sensor 402 at such driving frequency $f_2$.

At step 710, DSP 432 or another component of processing IC 412 may determine if a change in one, but not both, of amplitudes $A_1$ and $A_2$ has occurred between successive measurements at driving frequencies $f_1$ and $f_2$. If a change in one, but not both, of amplitudes $A_1$ and $A_2$ has occurred between successive measurements at driving frequencies $f_1$ and $f_2$, method 700 may proceed to step 712. Otherwise, method 700 may proceed to step 714.

At step 712, responsive to a change in one, but not both, of amplitudes $A_1$ and $A_2$ that has occurred between successive measurements at driving frequencies $f_1$ and $f_2$, DSP 432 or another component of processing IC 412 may determine that the change in amplitude resulted from electromagnetic interference at the driving frequency at which the change in amplitude occurred. Accordingly, DSP 432 may ignore such change in amplitude and/or may take one or more remedial measures to mitigate such electromagnetic interference (e.g., by changing one or both of driving frequencies $f_1$ and $f_2$). After completion of step 712, method 700 may proceed again to step 702.

At step 714, DSP 432 or another component of processing IC 412 may determine if a change in both of amplitudes $A_1$ and $A_2$ has occurred between successive measurements at driving frequencies $f_1$ and $f_2$. If a change in both of amplitudes $A_1$ and $A_2$ has occurred between successive measurements at driving frequencies $f_1$ and $f_2$, method 700 may proceed to step 716. Otherwise, method 700 may proceed again to step 716.

At step 716, DSP 432 or another component of processing IC 412 may determine if amplitudes $A_1$ and $A_2$ have diverged from one another. If amplitudes $A_1$ and $A_2$ have diverged from one another, method 700 may proceed to step 718. Otherwise, if amplitudes $A_1$ and $A_2$ have changed in the same direction (e.g., both increased or both decreased), method 700 may proceed to step 720.

At step 718, responsive to amplitudes $A_1$ and $A_2$ diverging from one another, DSP 432 or another component of processing IC 412 may determine that a change in inductance of resistive-inductive-capacitive sensor 402 has occurred, indicating human interaction with resistive-inductive-capacitive sensor 402 (e.g., a displacement of mechanical member 105 indicative of virtual button press or release), and process such change in inductance as a human interaction with resistive-inductive-capacitive sensor 402. In some embodiments, DSP 432 or another component of processing IC 412 may determine the change in inductance based on the magnitude of such divergence. After completion of step 718, method 700 may proceed again to step 702.

At step 720, responsive to amplitudes $A_1$ and $A_2$ changing in the same direction, DSP 432 or another component of processing IC 412 may determine that a change in quality factor of resistive-inductive-capacitive sensor 402 has occurred. In some embodiments, DSP 432 or another component of processing IC 412 may determine a magnitude of change in quality factor based on the amount of change of amplitudes $A_1$ and $A_2$. Further, in response to the change in quality factor, DSP 432 or another component of processing IC 412 may compensate for such change in quality factor, in any suitable manner Such compensation of quality factor is beyond the scope of this disclosure. After completion of step 720, method 700 may proceed again to step 702.

Although FIG. 7 discloses a particular number of steps to be taken with respect to method 700, it may be executed with greater or fewer steps than those depicted in FIG. 7. In addition, although FIG. 7 discloses a certain order of steps to be taken with respect to method 700, the steps comprising method 700 may be completed in any suitable order.

Method 700 may be implemented using resonant phase sense system 112 and/or processing IC 412, components thereof or any other system operable to implement method 700. In certain embodiments, method 700 may be implemented partially or fully in software and/or firmware embodied in computer-readable media.

It is noted that in the performance of method 700, it may be desirable or necessary that a measurement for amplitudes $A_1$ and $A_2$ be taken at driving frequencies $f_1$ and $f_2$ both before and after a detection of change inductance or quality factor has occurred. For instance, if a change in inductance occurs after step 706 but before step 708, it may be perceived as a change in amplitude $A_2$ without a change in amplitude $A_1$. At this point it may be desirable or necessary to take another measurement at driving frequency $f_1$ to determine whether amplitude $A_1$ has also changed. In other words, any time a change in amplitude is observed at a given driving frequency, it may be desirable to take an additional measurement at the other driving frequency to ensure the correct event is detected. Thus, while for purposes of clarity of exposition, method 700 does not depict this mechanism, such mechanism may nonetheless be performed within method 700.

Similar to that described above with respect to changes in amplitude, changes in measured phase at two difference driving frequencies $f_1$ and $f_2$ may be used in lieu of or in addition to amplitude in order to determine whether an inductance of resistive-inductive-capacitive sensor 402 has changed (indicating human interaction with resistive-inductive-capacitive sensor 402) or if a quality factor of resistive-inductive-capacitive sensor 402 has changed.

In response to a human interaction with resistive-inductive-capacitive sensor 402 (e.g., a displacement of mechanical member 105 indicative of virtual button press or release), an inductance of resistive-inductive-capacitive sensor 402 may change, leading to a shift in resonant frequency $f_0$ of resistive-inductive-capacitive sensor 402. However, the curve of the phase versus frequency relationship for resistive-inductive-capacitive sensor 402 may increase or decrease while maintaining approximately the same slope. For example, FIG. 8A depicts a decrease of the curve of the phase versus frequency relationship for resistive-inductive-capacitive sensor 402 in response to a change in inductance of resistive-inductive-capacitive sensor 402. Due to such decrease, measured phase $\phi_1$ at driving frequency $f_1$ and measured phase $\phi_2$ at driving frequency $f_2$ may both decrease. On the other hand, should a change in inductance cause an increase of the curve of the phase versus frequency relationship for resistive-inductive-capacitive sensor 402, measured phase $\phi_1$ at driving frequency $f_1$ and measured phase $\phi_2$ at driving frequency $f_2$ may both increase. Accordingly, a change in measured phases $\phi_1$, $\phi_2$ in the same direction (e.g., both increasing or both decreasing) may indicate a change in inductance. The change in inductance may be a function of the magnitude of the changes in measured phases $\phi_1$, $\phi_2$, as well as the polarity of such changes.

In response to a change in quality factor of resistive-inductive-capacitive sensor 402 (e.g., as may occur due to changes in temperature or other environmental effects), a resonant phase $f_0$ of resistive-inductive-capacitive sensor 402 may remain predominantly unchanged, but the curve of the phase versus frequency relationship for resistive-inductive-capacitive sensor 402 may change. Thus, as shown in FIG. 8B, when a change in quality factor of resistive-inductive-capacitive sensor 402 occurs, the measured phase at one of the driving frequencies may increase (e.g., an increase in measured phase $\phi_1$ at driving frequency $f_1$ in FIG. 8B) and the measured phase at the other of the driving frequencies may decrease (e.g., an increase in measured phase $\phi_2$ at driving frequency $f_2$ in FIG. 8B). Thus, a divergence (or convergence) in measured phases $\phi_1$, $\phi_2$ may indicate a change in quality factor of resistive-inductive-capacitive sensor 402. The change in quality factor may be a function of the magnitude of the divergence or convergence, as well as a function of whether the change is a divergence or convergence.

Further, driving resistive-inductive-capacitive sensor 402 at two different frequencies may enable detection of an interfering signal at one of the driving frequencies. For example, if the measured phase at a first driving frequency changes while the measured amplitude at a second driving frequency remains unchanged, the change in phase at the first driving frequency may indicate the presence of interference at the first driving frequency.

A method similar to that shown and described with respect to method 700 may be used to determine a change in inductance or quality factor of resistive-inductive-capacitive sensor 402 based on changes in the phase versus frequency relationship for resistive-inductive-capacitive sensor 402.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    a resistive-inductive-capacitive sensor;
    a driver configured to drive the resistive-inductive-capacitive sensor with a plurality of driving signals, each driving signal of the plurality of driving signals having a respective driving frequency; and
    a measurement circuit communicatively coupled to the resistive-inductive-capacitive sensor and configured to:
        measure a first value of a physical quantity associated with the resistive-inductive-capacitive sensor in response to a first driving signal of the plurality of driving signals, wherein the first driving signal has a first driving frequency;
        measure a second value of the physical quantity associated with the resistive-inductive-capacitive sensor in response to a second driving signal of the plurality of driving signals, wherein the second driving signal has a second driving frequency;
        measure a third value of the physical quantity associated with the resistive-inductive-capacitive sensor in response to the first driving signal;

measure a fourth value of the physical quantity associated with the resistive-inductive-capacitive sensor in response to the second driving signal;

determine a first difference between the third value and the first value;

determine a second difference between the fourth value and the second value; and based on the first difference and the second difference:
determine if a change in a resonant property of the resistive-inductive-capacitive sensor has occurred; and
determine if a change in a quality factor of the resistive-inductive-capacitive sensor has occurred.

2. The system of claim 1, wherein the measurement circuit is further configured to determine whether electromagnetic interference is present at one of the first driving frequency and the second driving frequency based on the first difference and the second difference.

3. The system of claim 2, wherein the measurement circuit is further configured to determine that:
interference is present at the first driving frequency if the first difference is non-zero and the second difference is zero; and
interference is present at the second driving frequency if the first difference is zero and the second difference is non-zero.

4. The system of claim 1, wherein:
a magnitude of difference between the first driving frequency and a resonant frequency of the resistive-inductive-capacitive sensor is equal to a magnitude of difference between the second driving frequency and the resonant frequency of the resistive-inductive-capacitive sensor; and
the measurement circuit is further configured to determine that a change in a resonant property of the resistive-inductive-capacitive sensor has occurred if the first difference is negative and the second difference is positive or if the first difference is positive and the second difference is negative.

5. The system of claim 4, wherein the resonant property is an impedance of the resistive-inductive-capacitive sensor.

6. The system of claim 4, wherein the resonant property is an inductance of the resistive-inductive-capacitive sensor.

7. The system of claim 4, wherein the resonant property is indicative of a displacement of a mechanical member relative to the resistive-inductive-capacitive sensor.

8. The system of claim 7, wherein the measurement circuit is further configured to determine an occurrence of a physical interaction associated with a human-machine interface associated with the mechanical member based on the displacement.

9. The system of claim 7, wherein the mechanical member is a metal plate.

10. The system of claim 1, wherein:
a magnitude of difference between the first driving frequency and a resonant frequency of the resistive-inductive-capacitive sensor is equal to a magnitude of difference between the second driving frequency and the resonant frequency of the resistive-inductive-capacitive sensor; and
the measurement circuit is further configured to determine that change in a quality factor of the resistive-inductive-capacitive sensor has occurred if the first difference and the second difference are both positive or if the first difference and the second difference are both negative.

11. The system of claim 1, wherein the physical quantity comprises amplitude information associated with the resistive-inductive-capacitive sensor.

12. The system of claim 1, wherein the physical quantity comprises phase information associated with the resistive-inductive-capacitive sensor.

13. The system of claim 1, wherein the measurement circuit comprises a coherent incident/quadrature detector and the measurement circuit is configured to measure the resonant property using the coherent incident/quadrature detector.

14. The system of claim 1, wherein the measurement circuit is further configured to determine a magnitude of the change in the resonant property based on at least one of the first difference and the second difference.

15. The system of claim 1, wherein the resonant property is a quality factor of the resistive-inductive-capacitive sensor.

16. A method comprising, in a system including a resistive-inductive-capacitive sensor and a driver configured to drive the resistive-inductive-capacitive sensor with a plurality of driving signals, each driving signal of the plurality of driving signals having a respective driving frequency:
measuring a first value of a physical quantity associated with the resistive-inductive-capacitive sensor in response to a first driving signal of the plurality of driving signals, wherein the first driving signal has a first driving frequency;
measuring a second value of the physical quantity associated with the resistive-inductive-capacitive sensor in response to a second driving signal of the plurality of driving signals, wherein the second driving signal has a second driving frequency;
measuring a third value of the physical quantity associated with the resistive-inductive-capacitive sensor in response to the first driving signal;
measuring a fourth value of the physical quantity associated with the resistive-inductive-capacitive sensor in response to the second driving signal;
determining a first difference between the third value and the first value;
determining a second difference between the fourth value and the second value; and
based on the first difference and the second difference, determining if a change in a resonant property of the resistive-inductive-capacitive sensor has occurred.

17. The method of claim 16, further comprising determining whether electromagnetic interference is present at one of the first driving frequency and the second driving frequency based on the first difference and the second difference.

18. The method of claim 17, further comprising determining that:
interference is present at the first driving frequency if the first difference is non-zero and the second difference is zero; and
interference is present at the second driving frequency if the first difference is zero and the second difference is non-zero.

19. The method of claim 16, wherein:
a magnitude of difference between the first driving frequency and a resonant frequency of the resistive-inductive-capacitive sensor is equal to a magnitude of difference between the second driving frequency and the resonant frequency of the resistive-inductive-capacitive sensor; and the measurement circuit is further configured to determine that a change in a resonant property of the resistive-inductive-capacitive sensor has occurred if the first difference is negative and the second difference is positive or if the first difference is positive and the second difference is negative.

20. The method of claim 19, wherein the resonant property is an impedance of the resistive-inductive-capacitive sensor.

21. The method of claim 19, wherein the resonant property is an inductance of the resistive-inductive-capacitive sensor.

22. The method of claim 19, wherein the resonant property is indicative of a displacement of a mechanical member relative to the resistive-inductive-capacitive sensor.

23. The method of claim 22, further comprising determining an occurrence of a physical interaction associated with a human-machine interface associated with the mechanical member based on the displacement.

24. The method of claim 22, wherein the mechanical member is a metal plate.

25. The method of claim 16, wherein:
a magnitude of difference between the first driving frequency and a resonant frequency of the resistive-inductive-capacitive sensor is equal to a magnitude of difference between the second driving frequency and the resonant frequency of the resistive-inductive-capacitive sensor; and
the method further comprises determining that change in a quality factor of the resistive-inductive-capacitive sensor has occurred if the first difference and the second difference are both positive or if the first difference and the second difference are both negative.

26. The method of claim 16, wherein the physical quantity comprises amplitude information associated with the resistive-inductive-capacitive sensor.

27. The method of claim 16, wherein the physical quantity comprises phase information associated with the resistive-inductive-capacitive sensor.

28. The method of claim 16, further comprising measuring the resonant property using a coherent incident/quadrature detector.

29. The method of claim 16, further comprising determining a magnitude of the change in the resonant property based on at least one of the first difference and the second difference.

30. The method of claim 16, wherein the resonant property is a quality factor of the resistive-inductive-capacitive sensor.

* * * * *

UNITED STATES PATENT AND TRADEMARK OFFICE
CERTIFICATE OF CORRECTION

| | |
|---|---|
| PATENT NO. | : 11,507,199 B2 |
| APPLICATION NO. | : 17/217235 |
| DATED | : November 22, 2022 |
| INVENTOR(S) | : John L. Melanson |

It is certified that error appears in the above-identified patent and that said Letters Patent is hereby corrected as shown below:

In the Specification

1. In Column 8, Line 41, delete "4," and insert -- $\phi$, --, therefor.

2. In Column 8, Line 49, delete "4," and insert -- $\phi$, --, therefor.

3. In Column 10, Line 61, delete "manner" and insert -- manner. --, therefor.

4. In Column 14, Line 15, delete "manner" and insert -- manner. --, therefor.

Signed and Sealed this
Seventh Day of March, 2023

Katherine Kelly Vidal
*Director of the United States Patent and Trademark Office*